United States Patent [19]

Lawson

[11] Patent Number: 4,741,023
[45] Date of Patent: Apr. 26, 1988

[54] ON-LINE TEST AND DIAGNOSTIC SYSTEM FOR POWER SYSTEM STABILIZER

[75] Inventor: Rodney A. Lawson, Fincastle, Va.

[73] Assignee: General Electric Company, Salem, Va.

[21] Appl. No.: 945,931

[22] Filed: Dec. 23, 1986

[51] Int. Cl.[4] .......................... G01R 31/34; H02P 9/00
[52] U.S. Cl. ...................................... 379/106; 322/99; 324/158 MG
[58] Field of Search ...................... 379/1, 93, 90, 102, 379/106, 109, 108; 322/99, 58, 22, 24; 324/158 MG

[56] References Cited

U.S. PATENT DOCUMENTS 4,463,306 7/1984 deMello et al. ...................... 322/25
4,626,622 12/1986 Bouvrette ............................ 379/106

Primary Examiner—Stafford D. Schreyer
Attorney, Agent, or Firm—Arnold E. Renner

[57] ABSTRACT

A method and apparatus for performing a complete functional test of a power system stabilizer connected to the excitation system of an electrical power generator is disclosed. Two tests are performed, one an on-line modulation test, and the second a system response test. In the on-line modulation test, an internal 0.5 hertz sine wave is generated by a microprocessor which is applied as a frequency modulating input to the continuous wave frequency transducer included in the power system stabilizer. Such a signal acts to stimulate intertie mode oscillations and provide a means of determining the gain and phase shift characteristic of the power system stabilizer. In the second test, a voltage step type of signal is generated and applied to the output of the power system stabilizer where it is then coupled to the excitation system of the generator. This has the effect of stimulating local mode oscillations. The generator response to the local mode oscillation is sensed to determine system damping. Both tests are adapted to verify the operational status of the power system stabilizer and the adequacy of its adjustments. Furthermore, a local terminal and a telephone modem are connected to a communication port associated with the microprocessor for enabling the test to be initiated and the results evaluated either locally or remotely.

42 Claims, 7 Drawing Sheets

ON-LINE TEST AND DIAGNOSTIC SYSTEM FOR POWER SYSTEM STABILIZER

CROSS REFERENCE TO RELATED APPLICATIONS

This application is related to:

U.S. patent application Ser. No. 945,741, entitled, "Digital Filter For Power System Stabilizer", filed on Dec. 23, 1986, in the name of B. C. Henderson, et al.; and U.S. patent application Ser. No. 945,482, entitled, "Negative Sequence Detector For A Continuous Wave Frequency Transducer", filed on Dec. 23, 1986, in the name of E. V. Larson, et al.

These applications are also assigned to the assignee of this application.

BACKGROUND OF THE INVENTION

This invention relates generally to apparatus for testing electrical equipment and particularly to built-in-test apparatus for performing on-line tests and providing a diagnostic capability of a digital power system stabilizer for an electrical turbine generator system.

A power system stabilizer (PSS) is an auxiliary control device which is used in connection with large power turbine generator excitation systems to increase the damping of the power system electromechanical oscillations. The details and operation of a power system stabilizer are well known to those skilled in the art and various types of implementations have been effected. In general, however, a power system stabilizer provides an adjustable amount of gain and phase lead between a signal proportional to generator shaft speed and generator output voltage utilizing an automatic voltage regulator and generator exciter. In the past, the power system stabilizer has been implemented by analog techniques using analog filters whose characteristics are designed to provide the desired gain and phase response. More recently, the state of the art has moved towards digital types of controls including the implementation of digital power system stabilizers.

Widespread utilization of power system stabilizers has been hampered, however, by the need for periodic testing of the apparatus to verify its operational status. These tests have typically required the services of a qualified expert to perform frequency response measurements at the site of the generator utilizing complex test equipment.

SUMMARY OF THE INVENTION

It is an object of the invention, therefore, to provide an improved technique for testing an electrical power generation system.

It is another object of the invention to provide a method and apparatus for testing a power system stabilizer utilized in connection with an electrical power generation system.

It is a further object of the invention to provide a method and apparatus for performing an on-line test of a power system stabilizer.

Still another object of the invention is to provide a performance test of a power system stabilizer either locally or remotely, to verify the existence of certain operating parameters for a given electrical generator system configuration.

Yet a further object of the invention is to provide for the testing of a power system stabilizer from a remote location, obviating the need for a specialist to be dispatched from a central engineering office to perform a required maintenance and performance test at the site of the generator.

The foregoing and other objects are achieved in accordance with the present invention by a method and apparatus for performing a complete functional test of a power system stabilizer by performing two tests, namely an on-line modulation test and a system response test.

In the on-line modulation test, an internal 0.5 hertz (Hz.) sine wave, generated by a microprocessor, is applied as a frequency modulating input to a continuous wave frequency transducer included in the power system stabilizer. Proper operation results in an output voltage at the modulating frequency being generated. The output signal from the continuous wave frequency transducer is processed and stored in a digital memory both before and after the initiation of the test. A comparison of the results provides a determination of both gain and phase shift to verify the correct operation of the power system stabilizer.

The second test comprises generating and inserting a voltage step type of signal into the power system stabilizer output which is coupled to the exciter circuitry of the generator. This has the effect of stimulating certain system oscillatory modes. The generator responses to this stimulation are sensed, stored and thereafter used to determine system damping under the existing system conditions.

These simple tests can be used to verify the operational status of the power system stabilizer and the adequacy of its adjustments. A local terminal and a telephone modem are also included and are connected to a communication port associated with a microprocessor included in the power system stabilizer providing a capability of providing a built-in-test feature which can be initiated and the results evaluated either locally or at a location remote from the power system.

BRIEF DESCRIPTION OF THE DRAWING

While the present invention is particularly defined in the claims annexed to and forming a part of this specification, a better understanding can be had of the following description when taken in conjunction with the accompanying drawing in which:

DETAILED DESCRIPTION OF THE INVENTION

Figure 1:
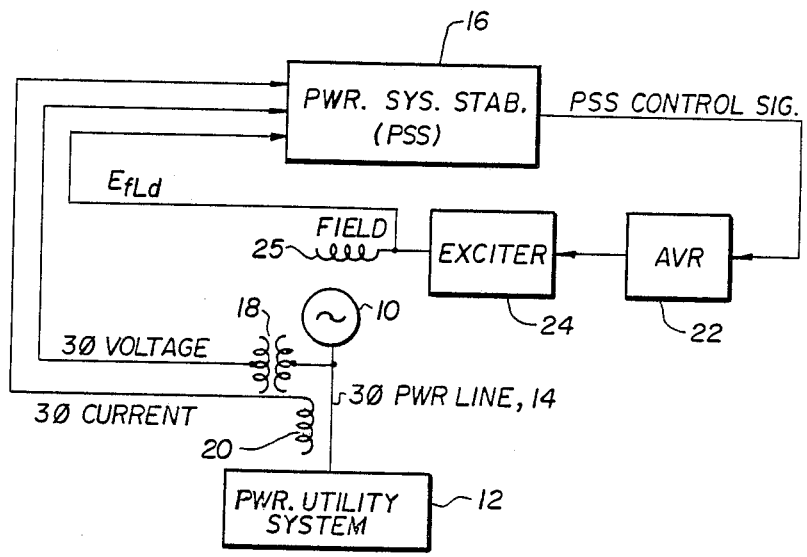
FIG. 1 is an electrical block diagram broadly illustrative of an electrical turbine generator power system including a power system stabilizer connected thereto.

Referring now to the figures and more particularly to FIG. 1, shown thereat is an alternating current (AC) power generation system including an AC generator 10, typically a three phase (3φ), 60 hertz (Hz.) turbine generator, which is coupled to a power utility system 12 via a 3φ transmission line 14. As is well known, such a system can exhibit undesired electromechanical oscillatory modes which if not adequately damped can cause oscillations which build up and result in the turbine-generator being removed from the system and/or resulting in catastrophic damage to the generator and associated equipment. These oscillations are suppressed by means of a power system stabilizer (PSS) 16 which receives voltage and current inputs from a set of 3φ potential transformers 18 and current transformers 20. The power system stabilizer 16 generates an analog feedback control signal which is fed to an automatic voltage regulator (AVR) 22 which controls the exciter 24 for the generator 10.

At relatively low power system oscillation frequencies between 0.1 and 2.0 Hz., the AVR 22, exciter 24, and generator 10 combination exhibits a phase lag. The power system stabilizer 16 is utilized to couple a signal proportional to generator rotor speed, line frequency, electrical power and/or combinations thereof into the AVR 22 and to provide a phase lead to compensate for this phase lag. The turbine generator 10 can also have torsional mechanical resonances whose damping can also be decreased by the action of the power system stabilizer. The power system stabilizer must, therefore, exhibit low gain at frequencies corresponding to torsional mechanical resonances. Since the predominant frequency is the fundamental system frequency, i.e. 60 Hz. for a 60 Hz. system, the power system stabilizer 16 also provides a low gain at the power system fundamental frequency in order to minimize the fundamental frequency noise.

Figure 2:
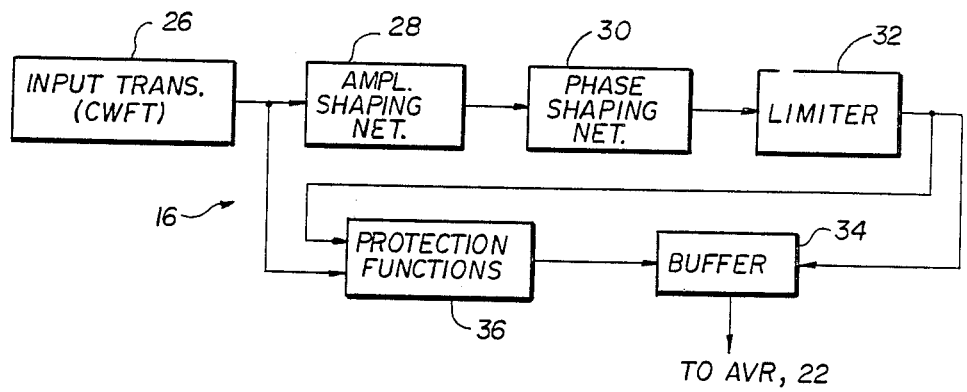
FIG. 2 is an electrical block diagram further illustrative of the power system shown in FIG. 1.

The power system stabilizer 16 is broadly disclosed in block diagrammatic form in FIG. 2 and typically comprises, among other things, an electrical input transducer 26 which generates a signal proportional to either rotor speed, generator frequency, generator electrical power or some combination thereof. Preferably, and in this invention, the transducer 26 comprises a continuous wave frequency transducer (CWFT) which generates a DC analog output signal proportional to the frequency of the generator terminal voltage. This signal is then fed to an amplitude shaping network 28, followed by a phase shaping network 30. The signal output from the phase shaping network 30 is then fed to a signal limiter 32 and to a buffer network 34 which provides proper scaling and isolation between the power system stabilizer and the automatic voltage regulator 22 shown in FIG. 1. Additionally, system protection circuitry 36 is also included, receiving inputs from the transducer 26 and the limiter 32 for inhibiting the signal transmission from the buffer 34, when necessary.

Figure 3:
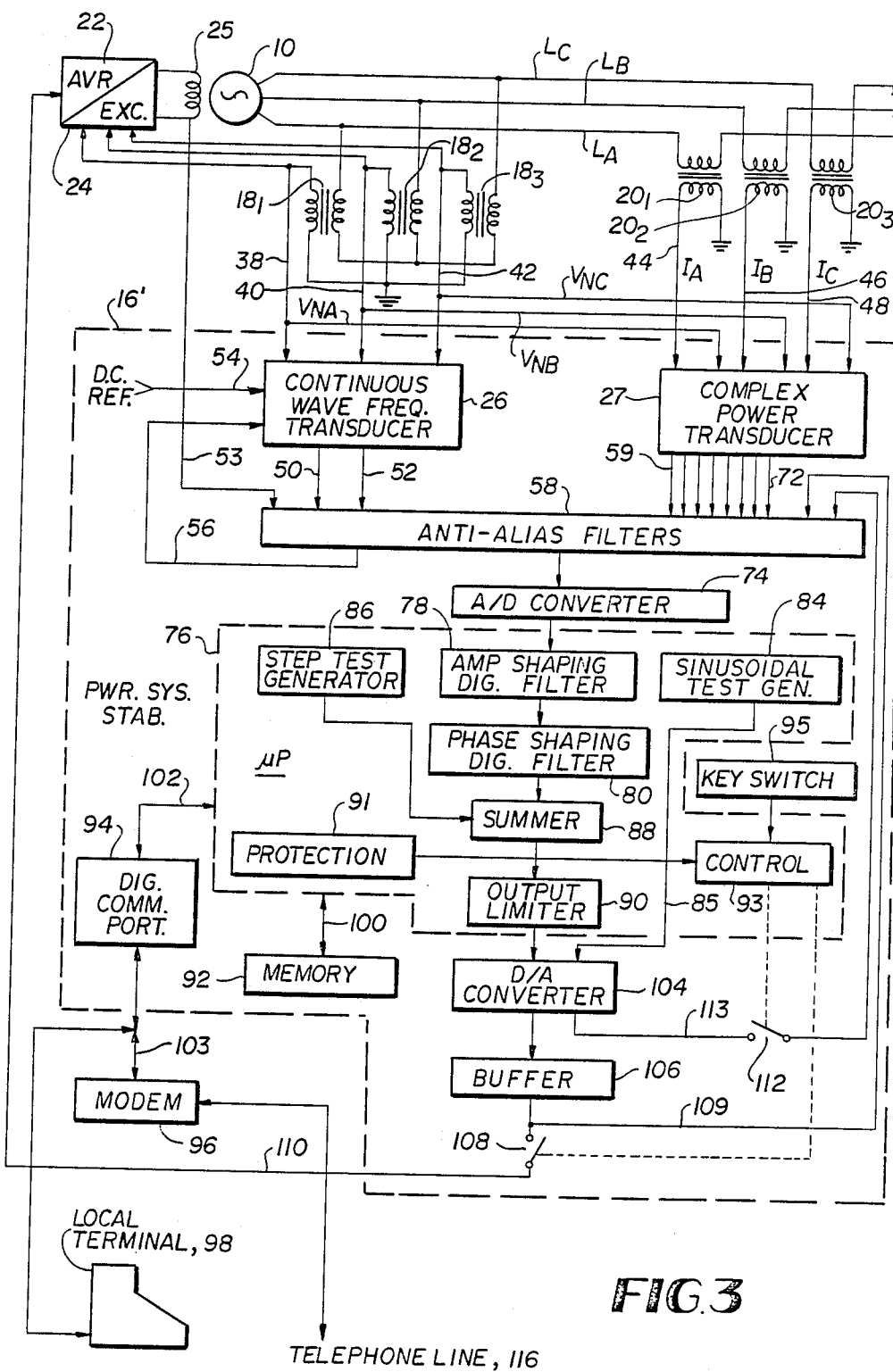
FIG. 3 is a detailed electrical block diagram illustrative of a digital power system stabilizer utilized in connection with the subject invention.
Figure 4:
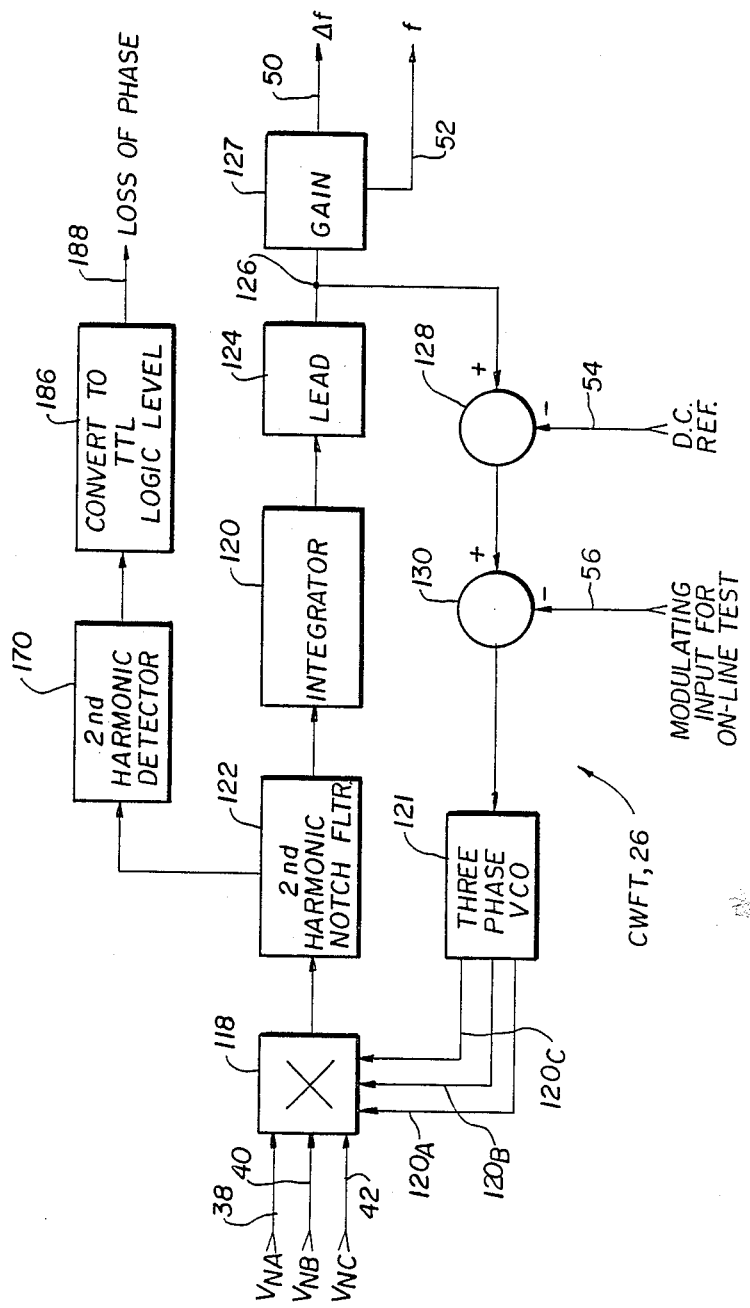
FIG. 4 is an electrical block diagram of a continuous wave frequency transducer which forms part of the power system stabilizer shown in FIG. 3.
Figure 8:
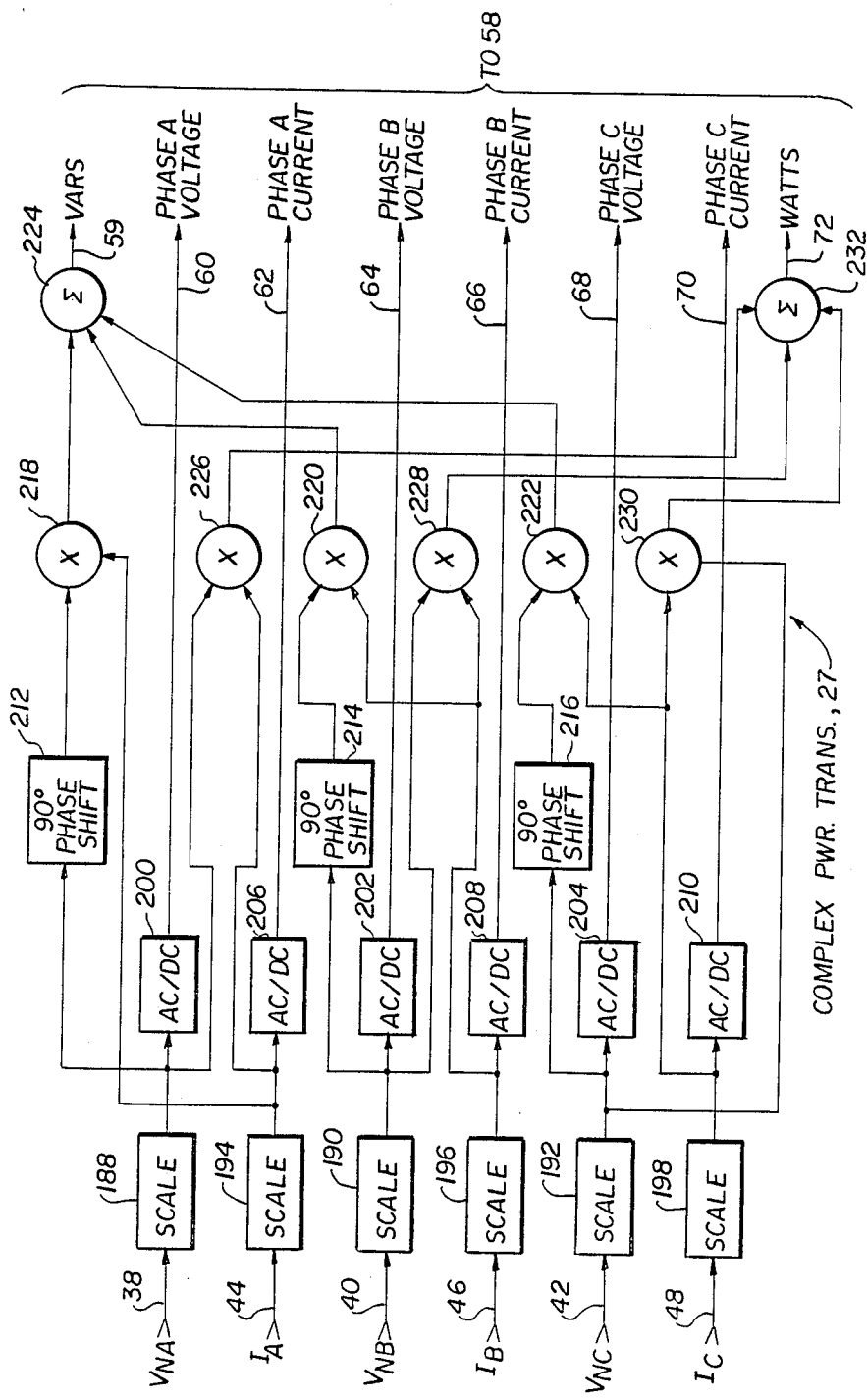
FIG. 8 is an electrical block diagram illustrative of the complex power transducer which forms part of the power system stabilizer shown in FIG. 3.

Referring now to FIG. 3, there is shown a digital power system stabilizer 16' which is utilized in connection with, as well as forms part of this invention. As illustrated, the output of the power system stabilizer 16' is coupled to the electrical generator 10 through an automatic voltage regulator 22 and exciter unit 24 connected to a field winding 25 of the generator 10. The generator 10 comprises a 3φ synchronous machine, including phases A, B and C, which is connected to three electrical power output lines $L_A$, $L_B$, $L_C$. Also shown in FIG. 3 are three potential transformers $18_1$, $18_2$ and $18_3$ whose primary windings are respectively connected to the power lines $L_A$, $L_B$ and $L_C$. The output windings of these transformers respectively provide signals corresponding to the line-to-neutral terminal voltages $V_{NA}$, $V_{NB}$ and $V_{NC}$. These are commonly coupled to the continuous wave frequency transducer 26 and to a complex power transducer 27 by means of the circuit leads 38, 40 and 42. Three current transformers $20_1$, $20_2$ and $20_3$ have their respective primary windings coupled in series with the three phase power lines $L_A$, $L_B$ and $L_C$ to provide signals in their respective secondary windings corresponding to the line currents $I_A$, $I_B$ and $I_C$. These line current signals are applied to the complex power transducer 27 via the signal leads 44, 46 and 48. The details of the continuous wave frequency transducer 26 and the complex power transducer 27 are shown in FIGS. 4 and 8 and will be discussed subsequently.

The continuous wave frequency transducer 26 provides two output signals on signal leads 50 and 52 corresponding, respectively, to a deviation from generator power line frequency (Δf) and power line frequency (f). The continuous wave frequency transducer 26 also receives a frequency reference DC input signal on lead 54 and, during an on-line test in accordance with the invention, a frequency modulating input signal on signal lead 56.

The outputs from the continuous wave frequency transducer 26 and the complex power transducer 27 are comprised of analog signals which are next digitized; however, before being converted to digital signals, they are fed through a set of anti-aliasing signal filters 58 which are utilized to remove high frequency components in the analog signals. Such high frequency components have a tendency to introduce distortion because of a sampling process which inherently comprises a part of digital signal handling operations. These filtered analog signals are converted to digital signals by an analog to digital (A/D) converter 74. The output of the A/D converter 74 is fed to a digital microprocessor 76 comprising, for example, an Intel 80286 microprocessor which is programmed with a set of programmed instructions to implement by means of software an amplitude shaping digital filter 78, a phase shaping digital filter 80, a sinusoidal test generator 84, a step test generator 86, a signal summer 88 and an output limiter 90.

The two filters 78 and 80 provide the necessary gain and phase compensation required for damping power system oscillation modes as taught in the above referenced related application entitled, "Digital Filter For Power System Stabilizer", (application Ser. No. 945,741). The output limiter 90 restricts the range of the output signal from the digital filters 78 and 80 so that the digital power system stabilizer cannot override normal regulator action during large signal operation. The signal summer 88 operates in conjunction with the step test generator 86 to inject a step voltage into the output of the power system stabilizer in accordance with one test to be described.

Also associated with the microprocessor 76 is a digital memory 92 and an RS232C compatible digital communications port 94, which in turn couples to a modem 96 or a local access terminal 98. A bidirectional digital data bus 100 couples the microprocessor 76 to the memory 92 while the communications port 94 is indirectly coupled to the memory via a bidirectional digital data bus 102 coupled to the microprocessor 76. The communications port is also coupled to the modem 96 and the local terminal via the data bus 103.

The digital output from the output limiter 90 included in the microprocessor 76 is fed to a digital to analog (D/A) converter 104. The analog output from the D/A converter 104 is then fed to a buffer amplifier 106 where it is applied to a summing junction, not shown, of the automatic voltage regulator 22 to apply a stabilizing signal in accordance with conventional practice. In this invention this signal is applied via a set of relay contacts 108 and signal lead 110. The relay contacts 108 provide an on-off control of the power system stabilizer signal in the event of a detected system failure as sensed by system protection software 91. The set of relay contacts 108 is controlled by a control block 93 of the microprocessor 76. The control block 93 also controls a second set of relay contacts 112 which, when closed, couple a signal from the sinusoidal test generator 84 through the D/A converter 104 and the anti-alias filters 58 to the continuous wave frequency transducer 26 via the signal lead 56.

The sinusoidal test generator 84 is used to frequency modulate the continuous wave frequency transducer 26 to perform an on-line operational test. The step test generator 86, on the other hand, is used to disturb the system as will be explained to test the settings of the power system stabilizer through the exciter unit 24. Local communication with the digital power system stabilizer 16, to initiate both of these tests, is by way of the local terminal 98 and communications port 94. Remote communication with the digital power system stabilizer 16 to initiate these tests is through the modem 96 coupled to a telephone line 116 and the communications port 94.

As noted above, the power system stabilizer 16' basically operates to provide a phase lead between the output of the continuous wave frequency transducer 26 and the line output voltage of the generator 10. In the quiescent state, its output is normally zero or very nearly zero. Because phase shift is critical to proper operation of the power system stabilizer and because normal operation produces essentially zero output voltage, the use of a suitable test signal is required for adequate determination of the operational status of the power system stabilizer 16'.

Frequencies of oscillation involving the aggregate of a plurality of turbine generator units at one end of a network oscillating against an aggregate of generator units at the other end of a network has become known as the intertie or interarea mode of oscillation. The natural frequency of intertie oscillatory modes is typically in the range of 0.2 to 0.5 Hz. Because this mode of oscillation involves many units oscillating as the equivalent of a single large unit, the oscillations are relatively insensitive to stimulation from a single turbine generator unit.

Accordingly, if a frequency near the intertie mode frequency is used for a test signal, there results very little system response so that response of the power system stabilizer to the test signal in this range is not corrupted by system responses. In the present invention, therefore, a test signal at 0.5 Hz. is generated by the sinusoidal test generator 84 of the microprocessor 76 and is applied to the continuous wave frequency transducer 26 in the digital power system stabilizer 16' for an on-line modulation test.

Directing attention now to FIG. 4, there is shown an embodiment of the continuous wave frequency transducer 26. This type of transducer is particularly useful since it has been found to be insensitive to noise that typically exists on this type of power system. As shown, the input to the continuous wave frequency transducer includes, first of all, the three phases $V_{NA}$, $V_{NB}$, and $V_{NC}$ of the generator terminal voltage which appear on signal leads 38, 40 and 42 (FIG. 3). The three terminal voltage signals are applied to a $3\phi$ multiplier circuit 118 which also receives three sinusoidal output signals appearing on signal lines $120_A$, $120_B$ and $120_C$ from a $3\phi$ voltage controlled oscillator (VCO) 121. The latter three signals are mutually spaced 120 electrical degrees apart and are in quadrature with the three input generator terminal voltages appearing on input leads 38, 40 and 42. The multiplier 118 operates to multiply like signal pairs and sum the resulting outputs. The summed output of multiplier 118 is coupled to an integrator 120 through a second harmonic notch filter 122. The output of the integrator is fed next to a lead network 124 having a transfer function of $1+ST$ where S comprises the Laplace transform operator, and T is the time constant of the lead network. Under normal operation, the output of the lead network appears at circuit node 126 and comprises a signal of varying amplitude proportional to the difference ($\Delta f$) between the instantaneous frequency of the generator terminal voltages and the anticipated nominal frequency. The signal appearing at circuit node 126 is applied to an output amplifier 127 having a predetermined gain and to one input of a summing junction 128 whose other input comprises a positive DC reference signal. This reference signal may be derived, for example, from the wiper arm of a suitable potentiometer, not shown, coupled between a source of positive potential and ground in a well known manner. Under ordinary operation, the output of the summing junction 128 comprises the input to the voltage controlled oscillator 121. The DC reference signal is set to a value which in the absence of any signal at node 126, will cause the voltage controlled oscillator 121 to run at a frequency equal to the anticipated frequency of the input signal, such as 60 Hz. for a 60 Hz. system.

The present invention, however, calls for an additional summing junction 130 to be located between summing junction 128 and the VCO 121 as shown in FIG. 4. The purpose of the summing junction 130 is for the application of the aforementioned 0.5 Hz. test signal generated by the sinusoidal test generator 84 and implemented in software by the PSS microprocessor 76 to frequency modulate the VCO 121. The 0.5 Hz. sinusoidal test signal is applied via signal lead 56 which is coupled back to the sinusoidal test generator 84 via the signal lead 85 coupled to the D/A converter 104, the set of relay contacts 112 and the anti-alias filters 58.

During the on-line modulation test mode, the frequency detection circuitry comprising the three phase multiplier 118 in the continuous wave frequency transducer 26, acts to demodulate the VCO 121, producing a 0.5 Hz. output signal on circuit lead 50 of the amplifier 127 having an amplitude proportional to the deviation in frequency ($\Delta f$).

In order to conduct such a test, the digital memory 92, which is coupled to the microprocessor 76 through the data bus 100, stores values of the 0.5 Hz. test input voltage appearing on signal lead 56, the output voltage from the continuous wave frequency transducer 26 on circuit lead 50, and the output voltage from the power system stabilizer 16' which appears at the output of the buffer 106 and which is fed back to the A/D converter 74 via circuit lead 109 and the filters 58. Access to the test results stored in the memory 92 is obtained via the communications port 94.

The data is stored in the memory 92 at a suitable rate, e.g. 20 Hz., such that the digitalization process does not introduce excess phase shift in the stored signals. The stored data permits one to determine the gain and phase shift through the power system stabilizer 16' by plotting individual data points corresponding to the power system stabilizer buffer output appearing on signal lead 109 and the input modulating signal applied to the continuous wave transducer on circuit lead 56. This calculation can then be compared to previous data to determine if any change had occurred from a set of parameters introduced into the system during a previous set-up procedure.

Figure 5:
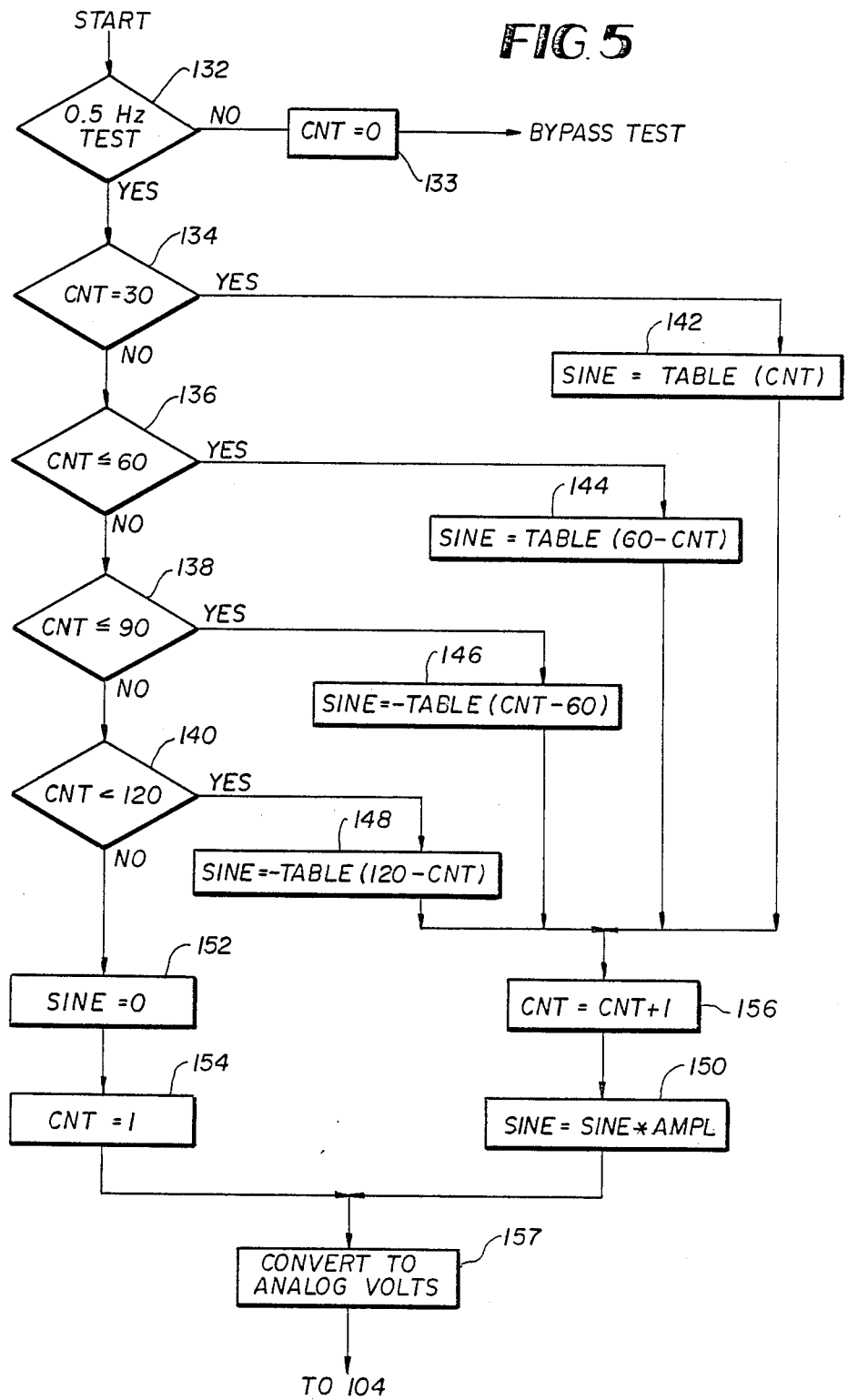
FIG. 5 is a flow diagram of a computer program for generating a sinusoidal signal for modulating the continuous wave frequency transducer shown in FIG. 4.

Considering now briefly the generation of the 0.5 Hz. sinusoidal test signal for carrying out the on-line modulation test, the sinusoidal test generator 84 generates a stepped approximation of a sine wave by means of a stored set of instructions or subroutine commonly referred to as a program. FIG. 5 discloses the flow chart utilized to implement the 0.5 Hz. sinusoidal test signal. The microprocessor 76 is programmed to include a table of sine values in the range between 0° and 90°. A program counter, not shown, contained in the microprocessor 76 is incremented for every pass through the program and runs at a 60 Hz. or line frequency rate. One quarter of a sine wave cycle (90°) corresponds to thirty passes through the program. The program, moreover, can generate sine values from 90° to 360° with the scheme shown in FIG. 5.

The first decision block 132 senses the initiation of an on-line modulation test. Decision blocks 134, 136, 138 and 140 indicate steps thereafter carried out to determine which quadrant the sine wave being generated is in. Blocks 142, 144, 146 and 148 comprise quadrant table look-up steps having different arguments depending upon the quadrant for which the sine values are desired. In order to scale the test signal, the values from the look-up table are multiplied by an amplitude factor in step 150 with the count increment being tracked in the step 156. At the end of each sine wave cycle, blocks 152 and 154 indicate steps providing for the output for sine 0° at the first count (count=1). A digital to analog conversion step is next performed as indicated by block 157 and which is implemented in the D/A converter 104 (FIG. 3) where it is then fed back to the continuous wave frequency transducer through the anti-alias filters 58 via the relay contacts 112 and signal lead 113 where it is then coupled to the summing junction 130 of FIG. 4.

Figure 6:
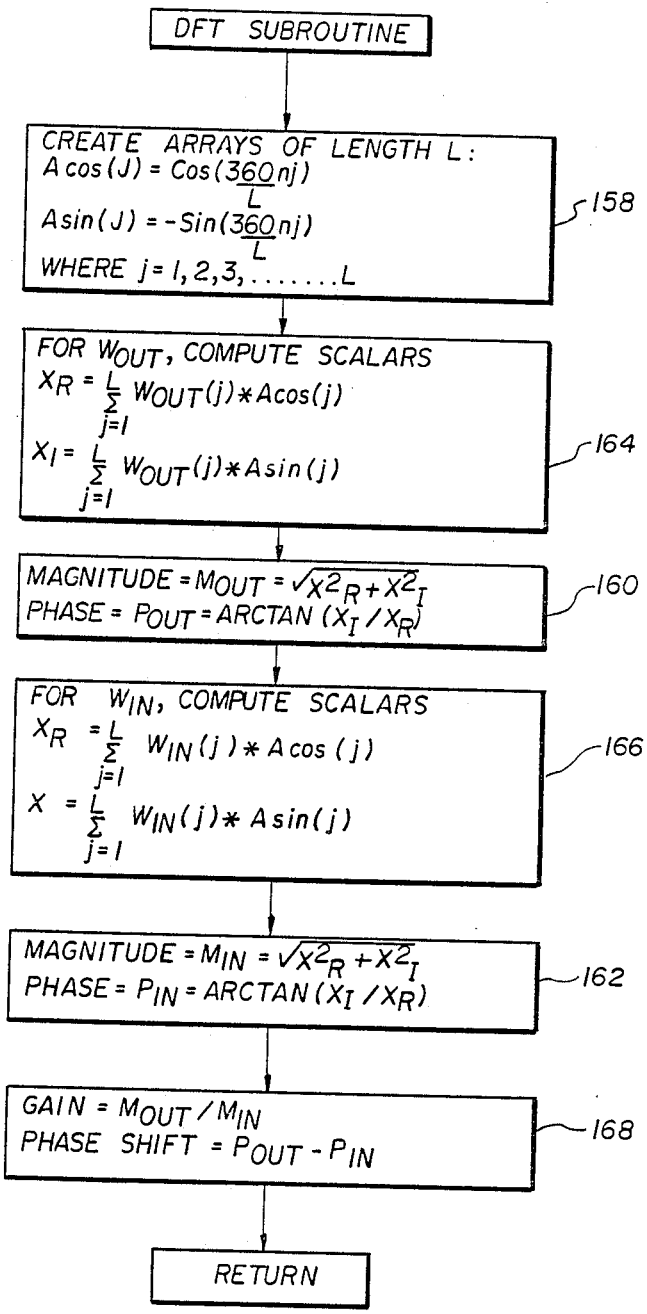
FIG. 6 comprises a flow diagram of a computer program for obtaining the discrete Fourier transform for obtaining gain and phase information in connection with an on-line modulation test in accordance with the subject invention.

Since data is obtained at a single frequency, very accurate gain and phase information can be obtained from the test results stored in the memory 92 by using a well known technique called the Discrete Fourier Transform (DFT). FIG. 6 discloses a flow diagram of a program implemented in the microprocessor 76 for obtaining the DFT of each measured variable. The details of such a subroutine are well known and disclosed, for example, in a publication entitled, "Use A Personal Computer And DFT To Extract Data From Noisy Signals", C. Foley, et al., EDN, Apr. 5, 1984, pp. 215-232.

In the present invention, gain is calculated by dividing the amplitude of the power system stabilizer output from the buffer 106, and appearing on signal lead 109 as shown in FIG. 3, by the amplitude of the sinusoidal modulating signal applied to the continuous wave frequency transducer 26 on signal lead 56. Phase shift is obtained by subtracting the phase of the modulating signal on lead 56 from the phase of the power system stabilizer output signal appearing on signal lead 109. It can be seen with reference to FIG. 6 that amplitude and phase values are determined in steps 160 and 162 following computation of certain scaler values in steps 164 and 166. The gain and phase shift is shown being calculated in step 168.

It should be noted that the continuous wave frequency transducer 26 continues to operate correctly during the presence of a condition known as negative sequence wherein one or two of the input phase voltages $V_{NA}$, $V_{NB}$ or $V_{NC}$ are lost. The low frequency 0.5 Hz. modulation test will not verify the integrity of the voltage input signal. However, loss of one or two phases of the generator terminal voltage causes a large second harmonic of the generator line frequency to be generated at the output of the three phase multiplier 118 (FIG. 4) of the continuous wave frequency transducer 26. Normally this second harmonic signal is fed to the integrator circuit 120 and the lead network 124; however, as disclosed in the above referenced related application entitled, "Negative Sequence Detector For Continuous Wave Frequency Transducer", (application Ser. No. 945,482), a second harmonic notch filter is inserted between the multiplier 118 and the integrator 120. The second harmonic notch filter, moreover, is implemented in the subject invention by a "biquad" active filter, a circuit well known to those skilled in the art of active filter design. Although not shown, one section of this filter provides a signal of the second harmonic if it is present. Further as taught in the above mentioned related application, a second harmonic detector circuit 170 is included in the continuous wave frequency transducer 26 shown in FIG. 4 to provide a signal indicative of the presence of this second harmonic. The details of the second harmonic detector are shown in FIG. 7.

Figure 7:
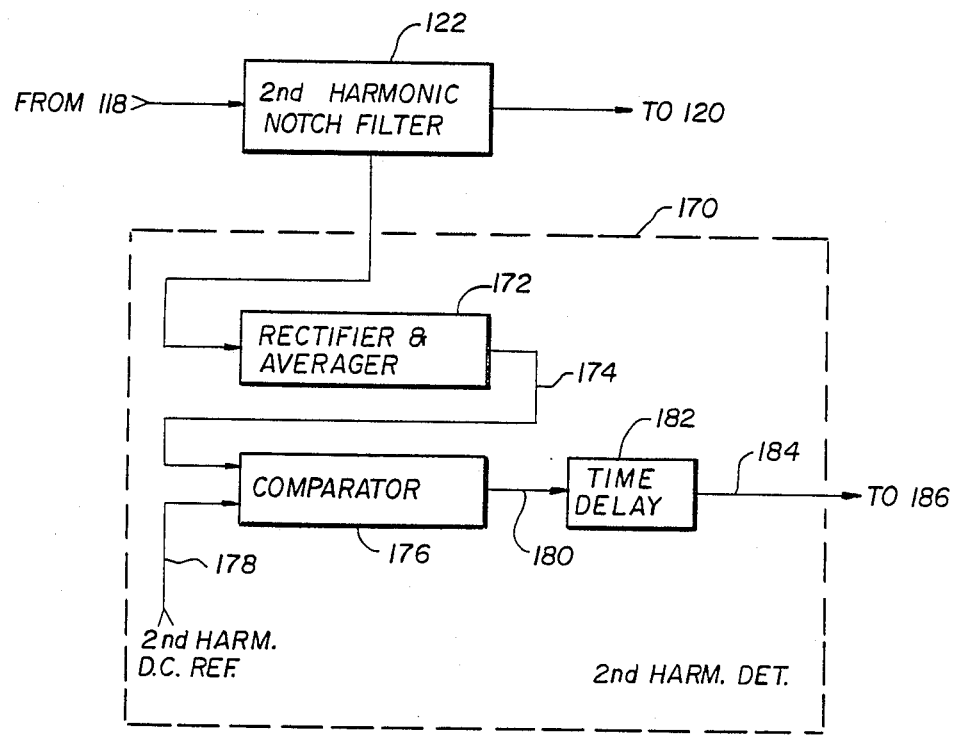
FIG. 7 is a block diagram of a loss of phase detector included in the continuous wave frequency transducer shown in FIG. 4.

Referring now to FIG. 7, the detector circuit 170 is comprised of a precision rectifier and filter circuit as shown by the block 172 which provides a signal on circuit lead 174 which is proportional to the average second harmonic signal content. This signal is then compared to a DC reference signal in a comparator circuit 176. The reference signal is applied from a source of variable DC potential, not shown, coupled to circuit lead 178. The output of the comparator changes state when the amplitude of the second harmonic signal exceeds the DC reference threshold level and appears as a signal on circuit lead 180. The output of the comparator is fed to a time delay circuit 182 which changes state after a predetermined time delay and provides a loss of phase signal on circuit lead 184. This loss of phase detection signal appearing on circuit lead 184 is thereafter converted to TTL logic levels in circuit block 186 shown in FIG. 4. A digital type of loss of phase signal appears on circuit lead 188 where it is coupled to the microprocessor 76 shown in FIG. 3. This change of state is read by the protection software 92 which in turn serves to operate an appropriate alarm. This in conjunction with the low frequency sinusoidal modulation test permits a complete functional test of the power system stabilizer control loop.

In addition to the ability to test and verify the functional status of the power system stabilizer 16', it is also vitally necessary to be able to demonstrate the adequacy of the adjustments made in the set-up of the desired filter characteristics of the amplitude shaping and phase shaping digital filters 78 and 80 of the power system stabilizer 16' as shown in FIG. 3. Current practice dictates that the power system stabilizer gain and time constant settings be found using known simulation and test techniques. These settings, furthermore, are normally a compromise, yielding adequate stability margins for anticipated loads and system configurations.

On excitation systems, such as shown in FIG. 1, exhibiting small time constants and for system configurations which result in little damping to the predominant system oscillatory frequency, the present invention also has for one of its primary objectives, in addition to the on-line modulation test, stimulating known oscillatory modes, called local modes, by inserting a step function type of voltage signal into the automatic voltage regulator (AVR) 22 shown in FIG. 3. To this end the microprocessor 76 includes a program which implements a step test generator shown by block 86 and which generates a small step signal coupled into the AVR 22 by way of the digital signal summer 88, output limiter 90, D/A converter 104, buffer 106, the set of relay contacts 108 when closed, and the signal lead 110.

The application of the step signal to the AVR 22 causes the generator field voltage controlled by the exciter 24 to abruptly change to a new value. This abrupt change in field voltage will stimulate the desired local oscillatory modes. The complex power transducer 27 shown in FIG. 3 and the continuous wave frequency transducer 26 included within the power system stabilizer 16' sense and convert the generator parameters then occurring into signals suitable for use by the PSS microprocessor 76.

Referring now to FIG. 8, there is shown a block diagram of the complex power transducer 27. The complex power transducer receives three terminal voltage inputs $V_{NA}$, $V_{NB}$, $V_{NC}$, and three line current inputs, $I_A$, $I_B$ and $I_C$ which appear on circuit leads 38, 40, ... 48. These analog input signals are fed to respective scaling circuits 188, 190, ... 198. The output of these scaling circuits are fed firstly to six respective AC/DC circuits 200, 202, ... 210, typically rectifiers, which provide phase voltage and line current outputs on signal leads 60, 62 ... 70. Two additional outputs corresponding to reactive volt-amperes (VARS) and power (WATTS) are provided on respective signal leads 59 and 72. The VARS output signal is generated by means of three 90° phase shifters 212, 214 and 216, respectfully coupled to the scalers 188, 190 and 192 for the phase voltage inputs $V_{NA}$, $V_{NV}$ and $V_{NC}$. The output of the phase shifters 212, 214, and 216 are respectively coupled to three multiplier circuits 218, 220 and 222 along with inputs from line current signal scalers 194, 196 and 198 for the phase currents $I_A$, $I_B$ and $I_C$. The outputs of the three multipliers 218, 220 and 222 are fed to the summing network 224 which provides a composite of the three VAR output signals on circuit lead 59. The complex power transducer additionally includes a second set of three multiplier circuits 226, 228 and 230 which is coupled to the phase voltage and line current signals from the scalers 188 ... 198 to provide three phase power signals for the phase A, B and C which are coupled to a summing network 232. The output of the summing network provides a composite of the three power signals on circuit lead 72.

The three phase voltage signals, the three line current signals, the generator electrical power signal and the generator reactive power signal appearing on the output leads 59 through 72 are converted to digital signals by the A/D converter 74 (FIG. 3), processed by microprocessor 76 and then stored in the memory 92 along with two other signals corresponding to deviation of generator frequency and generator field voltage which appear on circuit leads 50 and 53 from the continuous wave frequency transducer 26 and field winding 25, respectively, and as shown in FIG. 3 being coupled into the anti-alias filter 58 whereupon they are then converted by the A/D converter 74.

These signals are adequate for determining the relative stability of the system modes of oscillation and hence the adequacy of the power system stabilizer settings. The individual data points stored in the memory 92 are retrieved through the communications port 94 for either local or remote use.

One of the other main objectives of this invention is to provide for the capability of initiating and evaluating these performance tests from a remote location. As noted above, the microprocessor 76 included in the digital power system stabilizer 16 can be accessed using a standard telephone line 116, the modem 96 and the communication port 94. One can therefore, simply dial up the modem 96 from a remote location and gain access to the built-in-test capabilities programmed into the microprocessor 76. Either the 0.5 Hz. modulation test or the stimulation of local modes by the insertion of a voltage step into the AVR can be initiated from a remote location, with the test results being stored in memory 92 and thereafter retrieved via the telephone line connection to the modem 96.

Also, to allow individual station control over access to the power system stabilizer 16, a key switch 95 (FIG. 3) mounted on the power system stabilizer 16' must be placed in the test mode beforehand by station personnel with a proper password thereafter being entered from a remote location. This capability for remotely testing the power system stabilizer 16' will obviate the requirement for periodic visits to remote generating sites to perform maintenance tests on the power system stabilizer. As with the local test, test data stored in the memory 92 can be retrieved using the communications port 94 and modem 96 and plotted at a remote location to determine gain and phase shift information or, when desired, a Discrete Fourier Transform can be performed on both the power system stabilizer output signal appearing on signal lead 109 and the modulating input signal appearing on signal lead 56 to the continuous wave frequency transducer 26 to determine the gain and phase shift existing in the power system stabilizer.

Thus what has been shown and described is a technique for both performing a frequency response test and a test to verify adequacy of the adjustments of a digital power system stabilizer, both locally and from a remote location utilizing a built-in-test capability implemented by a microprocessor included in the power system stabilizer.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

What is claimed is:

1. A method of testing an electrical power generating system, comprising the steps of:
   (a) generating a test signal of a predetermined type at the initiation of a test procedure;
   (b) coupling the test signal into the system at a predetermined location;
   (c) sensing and storing signals corresponding to a selected number of system operating parameters both before and after the insertion of the test signal;
   (d) retrieving the stored signals; and
   (e) thereafter comparing respective signal characteristics of the retrieved signals, before and after the insertion of the test signal, to determine any differences therebetween and thereby provide an indication of the operational status of said electrical power generating system.

2. A method of testing an electrical power generating system including a power system stabilizer, comprising the steps of:
   (a) generating a test signal of a predetermined type at the initiation of a test procedure;
   (b) inserting the test signal into the system at the power system stabilizer;
   (c) sensing and storing signals corresponding to a selected number of system operating parameters both before and after the insertion of the test signal;
   (d) accessing and retrieving the stored signals; and
   (e) comparing respective signal characteristics of the retrieved signals before and after the insertion of the test signal to determine any difference therebetween and thereby provide an indication of operational status of said electrical power generating system.

3. The method as defined by claim 2 wherein said step (a) of generating a test signal comprises generating a sinusoidal type of test signal at a frequency in the range of the natural frequency of intertie oscillatory modes of the power generating system.

4. The method as defined by claim 3 wherein the frequency of the sinusoidal type test signal is in the range between and including 0.2 and 0.5 hertz.

5. The method as defined by claim 3 wherein said frequency of said test signal comprises a frequency of 0.5 hertz.

6. The method of claim 3 wherein said power system stabilizer additionally includes an electrical transducer which generates a signal proportional to the frequency of the generator terminal voltage, and wherein said test signal is applied to the transducer for frequency modulating the transducer.

7. The method as defined by claim 6 wherein said step (a) of generating the test signal comprises generating the signal locally.

8. The method as defined by claim 7 wherein said step (a) of locally generating the test signal comprises generating the test signal within the power system stabilizer.

9. The method as defined by claim 8 wherein said step (a) of generating said test signal comprises the step of digitally generating said test signal, and additionally including the step of: (f) converting the digital test signal to an analog signal and thereafter coupling the analog test signal to said transducer.

10. The method as defined by claim 9 and wherein said step (c) of sensing and storing signals further comprises the step of converting the sensed signals into digital signals, and then storing said digital signals in a digital memory.

11. The method as defined by claim 10 and wherein said step (d) of retrieving the stored signals comprises accessing the digital memory from a remote location and then retrieving stored digital signals therefrom.

12. The method as defined by claim 11 wherein said step of accessing the digital memory includes accessing by way of a modem coupled to a telephone line.

13. The method as defined by claim 12 and additionally including the step of initiating the generating of said test signal of step (a) from said remote location by way of said modem and telephone line.

14. The method as defined by claim 10 wherein said step (d) of retrieving the stored signals comprises accessing the digital memory locally by way of the local terminal coupled to said digital memory.

15. The method as defined by claim 6 wherein said step (c) of sensing and storing comprises storing a signal corresponding to the test signal applied to said transducer, storing a signal corresponding to the output of said transducer and storing a signal corresponding to the output of the power system stabilizer.

16. The method as defined by claim 15 wherein said step (c) of sensing and storing further comprises sensing and storing said signals substantially 0.5 seconds before the insertion of the test signal and substantially 10 seconds after the insertion of the test signal.

17. The method as defined by claim 2 wherein said step (a) of generating a test signal comprises generating a step function type of signal.

18. The method as defined in claim 17 wherein the step (b) of inserting the test signal comprises coupling the test signal to the excitation system of a generator coupled to the power system stabilizer of said electrical power generating system.

19. The method as defined by claim 18 wherein said step (b) of inserting the step function type of test signal comprises inserting the test signal into the output of the power system stabilizer, said power system stabilizer thereafter coupling said test signal to the excitation system of the generator.

20. The method as defined by claim 19 and wherein said step (a) of generating a test signal comprises generating the test signal locally.

21. The method as defined by claim 19 and wherein said step (a) of generating the test signal comprises generating the test signal within the power system stabilizer.

22. The method as defined by claim 21 and wherein said step (a) of generating a test signal comprises generating a digital type of test signal and further including the step of converting the digital test signal to an analog signal, said analog signal being thereafter coupled to the output of said power system stabilizer.

23. The method as defined by claim 22 wherein said test signal comprises a step function type of signal and step (c) includes storing said digital step function type of test signal.

24. The method as defined by claim 23 wherein said step (d) of retrieving stored signals comprises accessing said digital memory from a remote location.

25. The method as defined by claim 24 wherein said step (d) of accessing said memory from a remote location comprises accessing said memory via a modem connected to a telephone line.

26. The method as defined by claim 23 wherein said step of accessing said memory comprises locally accessing said memory through a local terminal coupled to said memory.

27. The method as defined by claim 18 wherein said step (c) of sensing and storing signals comprises storing signals corresponding to: (i) generator electrical output power, (ii) generator reactive output power, (iii) at least one phase voltage of the generator terminal voltage, (iv) generator line current, (v) generator output frequency, and (vi) generator field voltage.

28. The method as defined by claim 2 and additionally including the step of:
(f) initiating the test from a remote location, and comprising signal characteristics in step (c) also at said remote location.

29. The method as defined by claim 2 and additionally including the step of:
(f) activating an enabling switch locally and thereafter transmitting a password from a remote location to the system for initiating said step (a) of generating the test signal.

30. Apparatus for testing an electrical power generating system, comprising:
(a) at least one electrical generator including an excitation system;
(b) a power system stabilizer coupled to said excitation system for damping the electromechanical oscillations of said power generating system;
(c) test signal generation means included in the power system stabilizer;
(d) means for activating said test signal generation means;
(e) means for inserting said test signal at a predetermined point in said power generating system;
(f) means for sensing selected system parameters and generating signals corresponding thereto;
(g) means for storing said parameter signals; and
(h) means for selectively accessing said storing means and retrieving said parameter signals therefrom, whereby said respective parameter signals can be compared before and after the insertion of the test signal for determining system performance either locally or at a remote location.

31. The apparatus as defined by claim 30 wherein said test signal comprises a low frequency sinusoidal signal in the range of the natural frequency of intertie oscillatory modes of the power generating system.

32. The apparatus as defined by claim 31 wherein said power system stabilizer additionally includes an electrical transducer which generates a signal proportional to the frequency of the generator terminal output voltage; and wherein said means (e) for inserting said test signal comprises means for coupling said low frequency sinusoidal signal to said transducer for frequency modulating said transducer.

33. The apparatus as defined by claim 31 wherein said transducer comprises a continuous wave frequency transducer.

34. The apparatus as defined by claim 33 wherein said low frequency sinusoidal signal comprises a signal having a frequency in the range between and including 0.2 and 0.5 hertz.

35. The apparatus as defined by claim 30 wherein said test signal comprises a step voltage type of signal.

36. The apparatus as defined by claim 35 wherein said means (e) for inserting said test signal comprises means for coupling said voltage step signal to the excitation system of said electrical generator.

37. The apparatus as defined by claim 30 wherein said power system stabilizer comprises a digital power system stabilizer including a microprocessor, said microprocessor including a set of stored comparator programs implementing said test signal generator means.

38. The apparatus as defined by claim 37 wherein one of said stored computer programs operates to generate a 0.5 hertz sinusoidal test signal for stimulating intertie mode oscillations and another stored computer program operates to generate a step function signal for stimulating local mode oscillations.

39. The apparatus as defined by claim 38 and wherein said means for storing said parameter signals comprises a digital memory coupled to said microprocessor.

40. The apparatus as defined by claim 39 wherein said means (h) for selectively accessing said memory includes a digital communications port and additionally including a local terminal coupled to said digital communications port.

41. The apparatus as defined by claim 39 wherein said means (h) for selectively accessing said memory includes a digital communications port and additionally including a modem coupled to said digital communications port, said modem being coupled to a telephone line, whereby access to said parameter signals can be obtained at a remote location.

42. The apparatus as defined by claim 41 and additionally including a local switch means for enabling a test and means for transmitting a password from said remote location to said microprocessor for initiating the generation of at least one of said test signals.

* * * * *